(12) United States Patent
Kim

(10) Patent No.: US 7,884,399 B2
(45) Date of Patent: Feb. 8, 2011

(54) SEMICONDUCTOR DEVICE AND METHOD OF FABRICATING THE SAME

(75) Inventor: Dae-Kyeun Kim, Yongin-si (KR)

(73) Assignee: Dongbu HiTek Co., Ltd., Seoul (KR)

( * ) Notice: Subject to any disclaimer, the term of this patent is extended or adjusted under 35 U.S.C. 154(b) by 30 days.

(21) Appl. No.: 12/277,987

(22) Filed: Nov. 25, 2008

(65) Prior Publication Data

US 2009/0134477 A1 May 28, 2009

(30) Foreign Application Priority Data

Nov. 26, 2007 (KR) ............... 10-2007-0120646

(51) Int. Cl.
*H01L 29/76* (2006.01)

(52) U.S. Cl. ............. 257/288; 257/368; 257/382; 257/384; 257/E29.135; 257/E29.146; 257/E29.156

(58) Field of Classification Search ............. 257/288, 257/365, 368, 382, 384; 438/275, 302
See application file for complete search history.

(56) References Cited

U.S. PATENT DOCUMENTS

| 5,371,396 | A  | * | 12/1994 | Vinal et al. ............ | 257/412 |
| 5,418,392 | A  | * | 5/1995 | Tanabe ............ | 257/336 |
| 5,726,479 | A  | * | 3/1998 | Matsumoto et al. ............ | 257/412 |
| 5,739,573 | A  | * | 4/1998 | Kawaguchi ............ | 257/384 |
| 6,326,270 | B1 | * | 12/2001 | Lee et al. ............ | 438/279 |
| 7,056,782 | B2 | * | 6/2006 | Amos et al. ............ | 438/199 |
| 7,211,515 | B2 | * | 5/2007 | Lee et al. ............ | 438/682 |
| 2001/0019156 | A1 | * | 9/2001 | Matsuo et al. ............ | 257/368 |
| 2004/0063313 | A1 | * | 4/2004 | Shiratake et al. ............ | 438/672 |
| 2004/0104419 | A1 | * | 6/2004 | Bohr ............ | 257/308 |
| 2005/0208725 | A1 | * | 9/2005 | Kim et al. ............ | 438/286 |
| 2006/0148157 | A1 | * | 7/2006 | Tao et al. ............ | 438/199 |
| 2006/0273394 | A1 | * | 12/2006 | Matsumoto et al. ............ | 257/347 |
| 2007/0010051 | A1 | * | 1/2007 | Wu et al. ............ | 438/197 |
| 2007/0197011 | A1 | * | 8/2007 | Srivastava et al. ............ | 438/592 |
| 2008/0283974 | A1 | * | 11/2008 | Iwata ............ | 257/632 |

FOREIGN PATENT DOCUMENTS

KR   10-2002-0045010   6/2002

* cited by examiner

*Primary Examiner*—Ahmed Sefer
(74) *Attorney, Agent, or Firm*—Sherr & Vaughn, PLLC

(57) ABSTRACT

A semiconductor device and a method of fabricating the same include a gate electrode formed over the silicon substrate, the gate electrode including low-concentration conductive impurity regions, a high-concentration conductive impurity region formed between the low-concentration conductive impurity regions and a first silicide layer formed over the high-concentration conductive impurity region, and contact electrodes including a first contact electrode connected electrically to the gate electrode and a second contact electrode connected electrically to source/drain regions. The first contact electrode contacts the uppermost surface of the gate electrode and a sidewall of the gate electrode. The gate electrode can be easily connected to the contact electrode, the high-concentration region can be disposed only on the channel region, making it possible to maximize overall performance of the semiconductor device.

18 Claims, 4 Drawing Sheets

SEMICONDUCTOR DEVICE AND METHOD OF FABRICATING THE SAME

Figure 1:
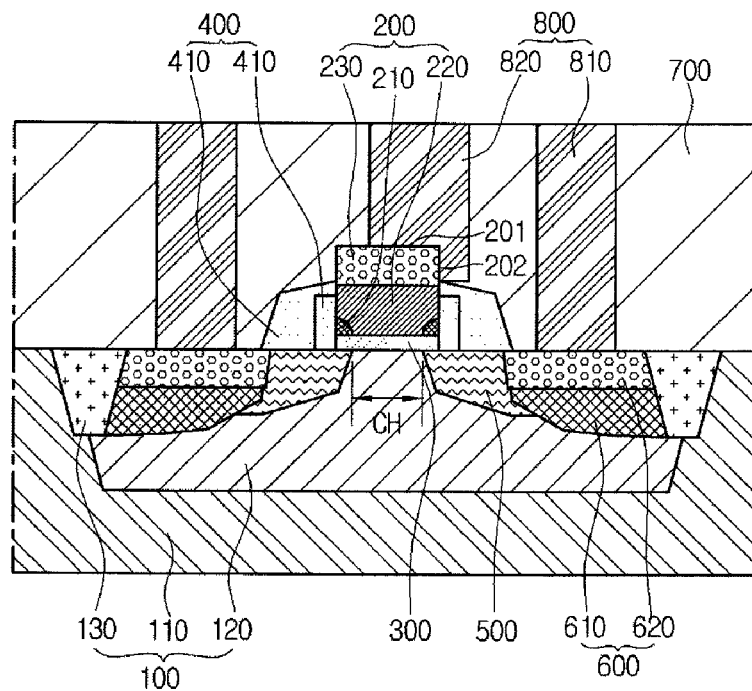
Figure 2:
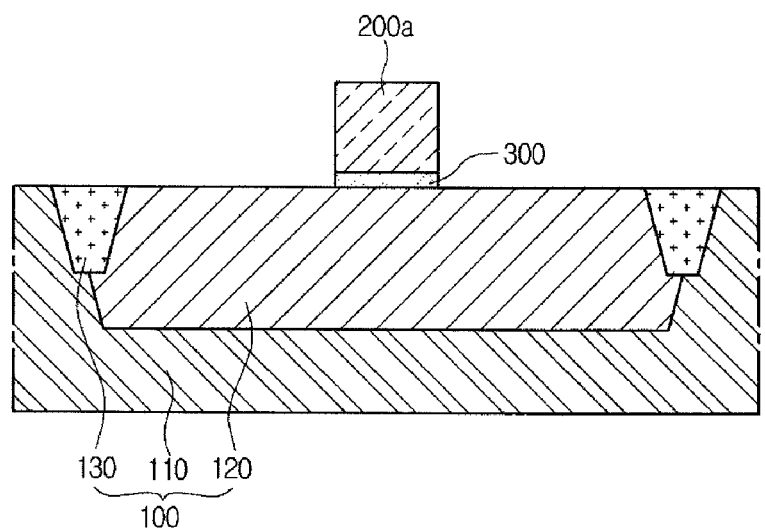

The present application claims priority under 35 U.S.C. §119 to Korean Patent Application No. 10-2007-0120646 (filed on Nov. 26, 2007), which is hereby incorporated by reference in its entirety.

BACKGROUND

With the recent development of information processing techniques, there has been an increase in demand for high integration and high density semiconductor devices. However, in accordance with the high integration of the semiconductor devices, there are problems such as misalignment between a semiconductor device and a contact electrode and void generation between semiconductor devices.

SUMMARY

Embodiments relate to a semiconductor device and a method of fabricating the same in which a gate electrode can be connected easily to a contact electrode.

Embodiments relate to a semiconductor device and a method of fabricating the same having maximized performance.

Embodiments relate to a semiconductor device and a method of fabricating the same that reduces void generation between the semiconductor devices.

Embodiments relate to a semiconductor device that may include at least one of the following: a gate electrode disposed on and/or over a semiconductor substrate; a spacer disposed on and/or over the side surface of the gate electrode and exposing a portion of the side surface of the gate electrode; and a source/drain region disposed at one side of the gate electrode.

Embodiments relate to a method of fabricating a semiconductor device that may include at least one of the following: forming a gate electrode on and/or over a semiconductor substrate; forming a spacer which exposes a portion of a side surface of the gate electrode on and/or over the side surface of the gate electrode; and then forming a source/drain region at one side of the gate electrode.

Embodiments relate to a device that may include at least one of the following: a gate electrode formed over a semiconductor substrate; spacers formed at sidewalls of the gate electrode and exposing a portion of the sidewalls of the gate electrode; a source/drain region formed in the semiconductor substrate at lateral sides of the gate electrode; and a contact electrode formed over the semiconductor substrate to contact the sidewall and an uppermost surface of the gate electrode.

Embodiments relate to a device that may include at least one of the following: a silicon substrate; a gate electrode formed over the silicon substrate, the gate electrode including low-conductive impurity concentration regions formed spaced apart at lower edge portions of the gate electrode, a high-conductive impurity concentration region formed between the low-conductive impurity concentration regions and a first silicide layer formed over the high-conductive impurity concentration region; source/drain regions formed in the silicon substrate adjacent lateral sides of the gate electrode; a dielectric film formed over the silicon substrate including the gate electrode and the source/drain regions; and contact electrodes formed penetrating through the dielectric film including a first contact electrode connected electrically to the gate electrode and a second contact electrode connected electrically to the source/drain regions. In accordance with embodiments, the first contact electrode contacts the uppermost surface of the gate electrode and a sidewall of the gate electrode.

Embodiments relate to a method that may include at least one of the following: forming a gate electrode over a silicon substrate, the gate electrode including first conductive impurity regions formed spaced apart at bottom edge portions of the gate electrode, a second conductive impurity region formed between the first conductive impurity regions and a first silicide layer formed over the second conductive impurity region; and then forming spacers exposing a portion of the sidewalls of the gate electrode; and then forming source/drain regions in the silicon substrate adjacent lateral sides of the gate electrode; and then forming a dielectric film over the silicon substrate including the gate electrode and the source/drain regions; and then forming a first contact electrode in the dielectric film connected electrically to the gate electrode and a second contact electrode in the dielectric film connected electrically to the source/drain regions. In accordance with embodiments, the first contact electrode contacts the uppermost surface of the gate electrode and a sidewall of the gate electrode.

DRAWINGS

Example FIGS. 1 to 8 illustrate an NMOS transistor of a semiconductor device and a method of fabricating a NMOS transistor of a semiconductor device in accordance with embodiments.

DESCRIPTION

Example FIG. 1 is a cross-sectional view of a NMOS transistor of a semiconductor device in accordance with embodiments. Referring to FIG. 1, the NMOS transistor includes semiconductor substrate 100, gate electrode 200, gate dielectric film 300, spacers 400, lightly doped drain (LDD) regions 500, source/drain regions 600, interlayer dielectric films 700 and contact electrodes 800.

In silicon substrate 110 implanted with an n-type impurity, device isolation film 130 is formed using a shallow trench isolation (STI) process or a LOCOS process. A p-type impurity is implanted to form a p-well 120 therein, thereby completing semiconductor substrate 100. gate dielectric film 300 is formed on and/or over p-well 120. Gate electrode 200 is disposed on and/or over semiconductor substrate 100 including gate dielectric film 300.

Gate electrode 200 includes low-concentration regions 210, high-concentration region 220 and first silicide layer 230. Low-concentration regions 210 include a conductive impurity having lower concentration than high-concentration region 220. Low-concentration regions 210 are formed on and/or over gate dielectric film 300 and are adjacent to spacer 400. Low-concentration regions 210 are spaced from each other and correspond to a respective LDD region 500. Low-concentration regions 210 have higher electric resistance than high-concentration region 220. High-concentration region 220 is formed between the pair of low-concentration regions 210. High-concentration region 220 has a conductive impurity having higher concentration than low-concentration regions 210. High-concentration region 220 has lower electric resistance than the low-concentration region 210. High-concentration region 220 is formed corresponding to a region between the pair of LDD regions 500. In other words, high-concentration region 220 is formed on and/or over channel region CH. First silicide layer 230 is formed on and/or over and contacts high-concentration region 220. First silicide layer 230 includes silicide, for example, and is connected electrically to high-concentration region 220 and contact electrode 800.

Gate dielectric film 300 is interposed between gate electrode 200 and semiconductor substrate 100. As gate dielectric film 300, material such as silicon oxide (SiOx) or the like may be used. Gate dielectric film 300 serves to insulate at least the bottom region of gate electrode 200. Spacer 400 is disposed on and/or over sidewalls of gate electrode 200 to insulate the sidewalls. Spacer 400 exposes a portion of the sidewalls of gate electrode 200. More specifically, spacer 400 exposes a portion of the upper sidewalls of gate electrode 200. For example, the height of spacer 400 is less than that of gate electrode 200. Spacer 400 includes first spacer 410 composed of TEOS material and second spacer 420 composed of a nitride material.

LDD regions 500 are formed spaced apart in p-well 120 spatially below and overlapping spacer 400 and low-concentration regions 210. LDD regions 500 are formed by implanting a low-concentration n type impurity into semiconductor substrate 100. Source/drain regions 600 are formed in the semiconductor substrate 100 at one side of gate electrode 200. Source/drain region 600 is formed at the sidewall of a respective LDD region 500. Source/drain region 600 includes a first source/drain region 610 into which high-concentration n-type impurities are implanted and second source/drain region which includes silicide layer 620 composed of silicide.

Interlayer dielectric film 700 is formed on and/or over the entire semiconductor substrate 100 including gate electrode 200, spacer 400 and source/drain region 600. As interlayer dielectric film 700, material such as a boron phosphorus silicate glass (BPSG) or an undoped silicate glass (USG) may be used.

Contact electrodes 800 are formed penetrating through interlayer dielectric film 700. As the contact electrode 800, a metal material such as aluminum, copper and tungsten may be used. Contact electrode 800 includes first contact electrode 820 and second contact electrode 810. First contact electrode 820 is connected electrically to gate electrode 200. More specifically, first contact electrode 820 contacts the uppermost surface 201 and a sidewall 202 of gate electrode 200 to be connected electrically to gate electrode 200. Second contact electrode 810 is formed on and/or over source/drain regions 600 and is connected electrically to source/drain region 600.

The NMOS transistor in accordance with embodiments includes spacer 400 which exposes a portion 202 of the upper sidewall of gate electrode 200, making it possible to allow contact electrode 800 to contact the uppermost surface 201 and sidewall 202 of gate electrode 200. Therefore, the NMOS transistor in accordance with embodiments can reduce an electrical short phenomenon between gate electrode 200 and contact electrode 800.

Also, the NMOS transistor in accordance with embodiments includes spacer 400 having a lower height than gate electrode 200, making it possible to fill between the semiconductor devices with the interlayer dielectric film sufficiently and reduce void generation between the semiconductor devices compared to a semiconductor device including a higher spacer-gate electrode height ratio.

Also, the NMOS transistor in accordance with embodiments includes high-concentration region 220 having low resistance corresponding to only the channel region CH formed between the pair of LDD regions 500, thereby making it possible to allow much more current to flow in the channel region CH and maximize the performance of the semiconductor device.

In accordance with embodiments, the semiconductor device may be based on a NMOS transistor, however, can be applied to a PMOS transistor in the same manner.

Example FIGS. 2 to 8 are cross-sectional views showing processes of a method of fabricating a NMOS transistor of a semiconductor device in accordance with embodiments. Referring to example FIG. 2, in a silicon substrate 110 to which a low-concentration n type impurity is implanted, a device isolation film 130 is formed using a STI process or a LOCOS process. Thereafter, a low-concentration p-type impurity is implanted into the silicon substrate 110 to form a p-well 120, thereby forming semiconductor substrate 100. After p-well 120 is formed, an oxide film is formed on and/or over semiconductor substrate 100 using a thermal oxidation process, a chemical vapor deposition (CVD) process or the like, and a poly silicon layer is formed on and/or over the oxide film using the CVD process or the like. Thereafter, the oxide film and the poly silicon layer are patterned using a mask process to thereby form gate dielectric film 300 and gate pattern 200a on and/or over semiconductor substrate 100.

Figure 3:
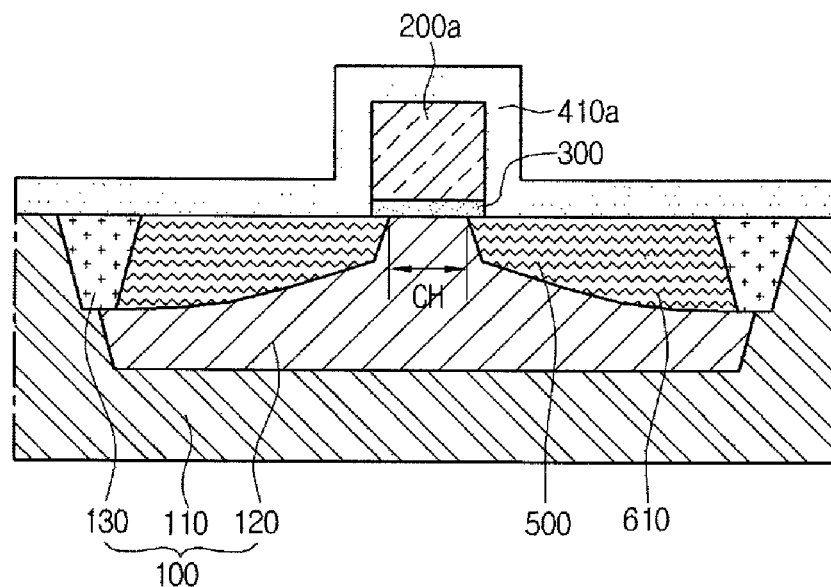

Referring to example FIG. 3, after forming gate pattern 200a, a low-concentration n-type impurity is implanted into p-well 120 using gate pattern 200a as a mask and is then diffused using an annealing process, thereby forming LDD regions 500. LDD regions 500 are also formed below and overlap gate pattern 200a. Thereafter, TEOS film 410a is formed on and/or over semiconductor substrate 100 including the uppermost surface and sidewalls of gate pattern 200a.

Figure 4:
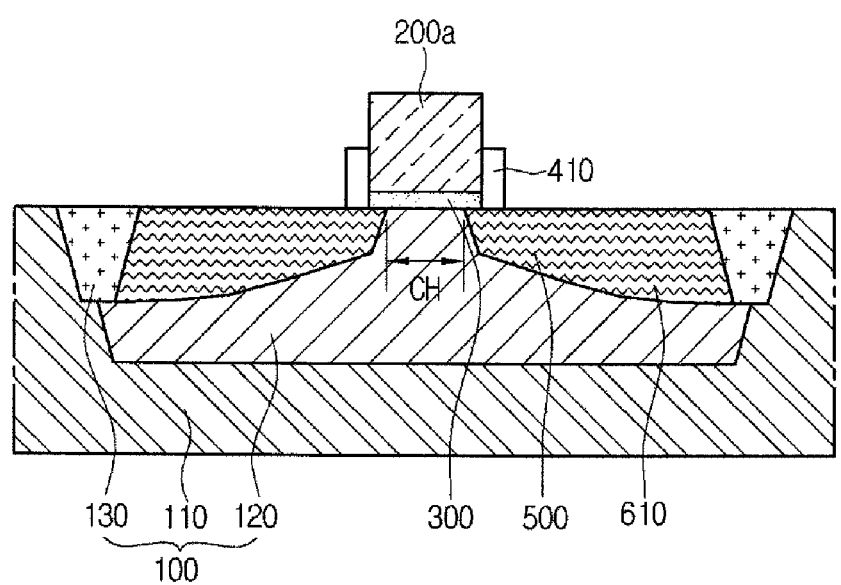

Referring to example FIG. 4, TEOS film 410a is etched by an anisotropic etching process exposing the uppermost surface of semiconductor substrate 100 and the uppermost surface and a portion of the upper sidewall of gate pattern 200a, thereby forming first spacer 410. First spacer 410 has a lower height than gate pattern 200a.

Figure 5:
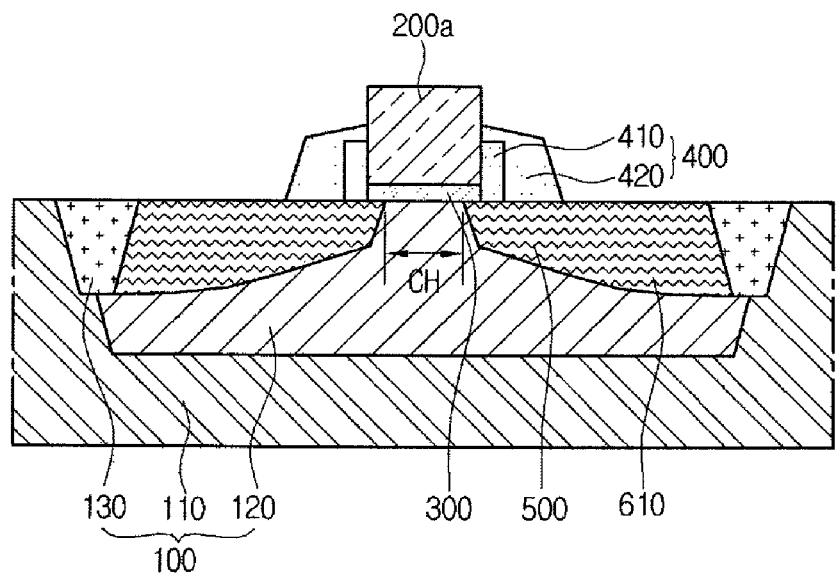

Referring to example FIG. 5, after forming first spacer 410, a nitride film is formed on and/or over semiconductor substrate 100. A second anisotropic etching process is performed on the nitride film to thereby form second spacer 420 on and/or over first spacer. Second spacer 420 exposes a portion of the upper sidewalls of gate pattern 200a and may cover first spacer 410.

Figure 6:
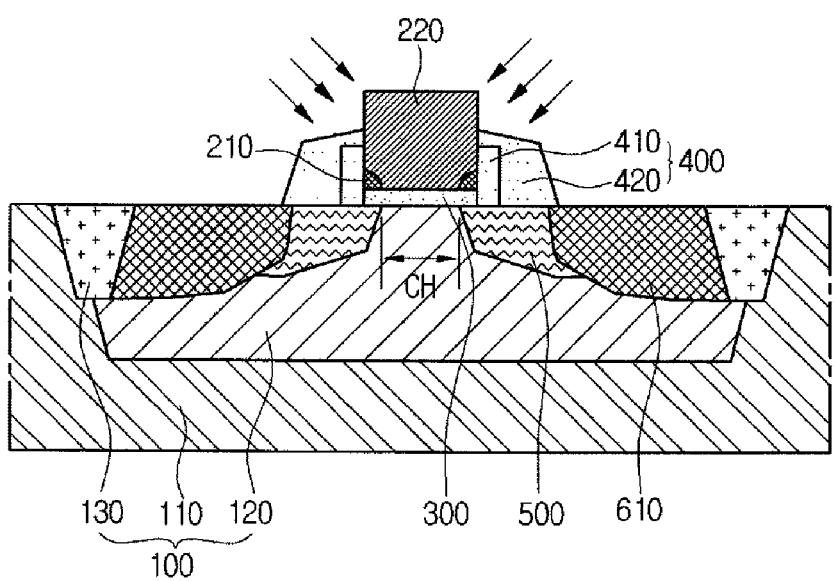

Referring to example FIG. 6, after forming spacer 400, a high-concentration n-type impurity is implanted into semiconductor substrate 100 to form region 610. The n-type impurity may be implanted at various angles, such as substantially perpendicular relative to the uppermost surface of semiconductor substrate 100 and tilted non-perpendicularly relative to the uppermost surface of semiconductor substrate 100. The n-type impurity is also implanted into gate pattern 200a such that a relative low-concentration n-type impurity is implanted at the bottommost edge regions thereof since the bottommost edge regions are hidden by spacer 400. Meaning, low-concentration region 210 and high-concentration region 220 are simultaneously formed in gate pattern 200a.

Figure 7:
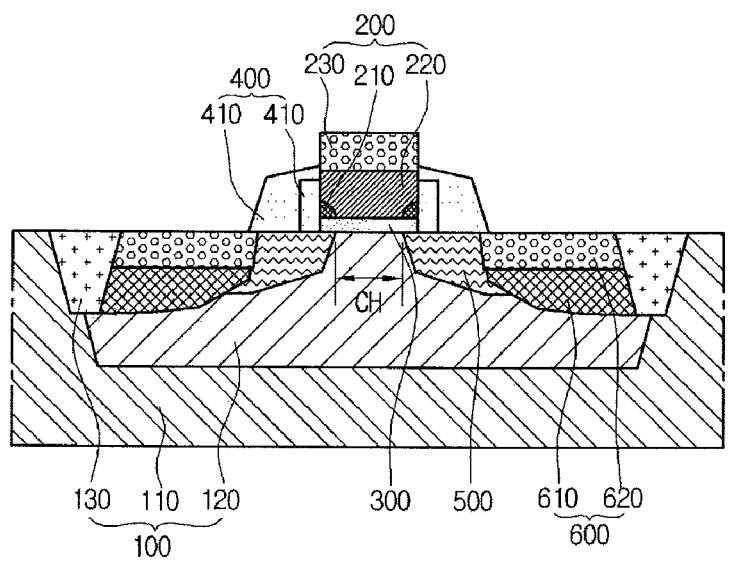

Referring to example FIG. 7, a metal-based material such as nickel is deposited on and/or over the uppermost surface of gate pattern 200a, the exposed upper sidewall portion of gate pattern 200a, and region 610 to which the high-concentration n type impurity is implanted. An annealing process and a cleaning process are then performed thereon, thereby forming first silicide layer 230 and second silicide layer 620. In other words, gate electrode 200 including low-concentration region 210, high-concentration region 220 and first silicide layer 230 is formed, and source/drain region 600 including second silicide layer 620 are simultaneously formed.

Figure 8:
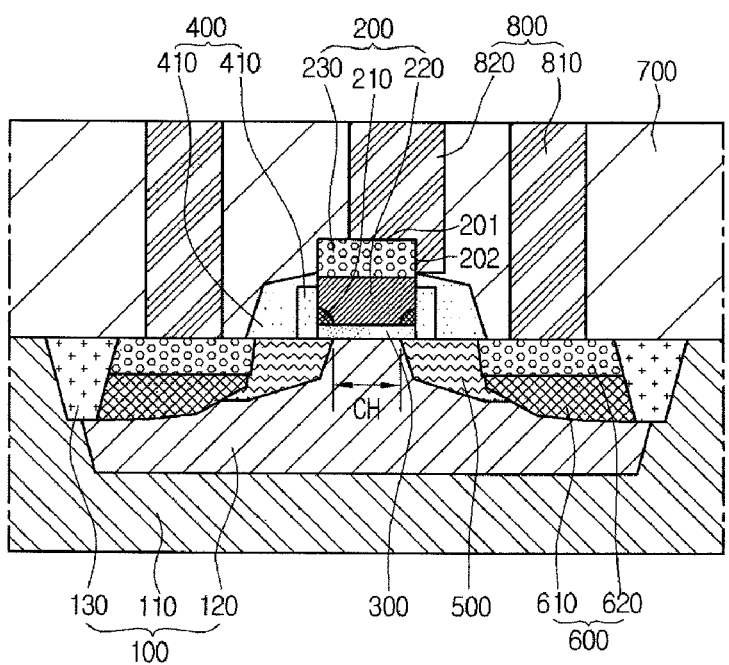

Referring to example FIG. 8, after forming interlayer dielectric film 700 on and/or over semiconductor substrate 100, a via hole is formed penetrating interlayer dielectric film 700. A metal-based material is then buried in the via hole, thereby forming contact electrode 800. First contact electrode 820 contacts the uppermost surface and exposed upper sidewall portion of gate electrode 200 and second contact electrode 810 contacts second silicide layer 620.

The semiconductor device and the method of fabricating the same in accordance with embodiments exposes not only the uppermost surface but also the upper sidewall of the gate electrode. Therefore, the gate electrode can be easily connected to the contact electrode. The high-concentration region to which the high-concentration conductive impurity is implanted and the low-concentration region to which the relatively low-concentration conductive impurity is implanted can be included, or the high-concentration region can be disposed only on and/or over the channel region, making it possible to maximize the overall performance of the semiconductor device. The spacer having a lower height than the gate electrode is included so that the space between the semiconductor devices is larger compared to the case when the height of the spacer is equivalent to or higher than that of the gate electrode, making it possible to prevent void generation between semiconductor devices.

Although embodiments have been described herein, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A device comprising:
   a gate electrode formed over a semiconductor substrate;
   spacers formed at sidewalls of the gate electrode and exposing a portion of the sidewalls of the gate electrode;
   a source/drain region formed in the semiconductor substrate at lateral sides of the gate electrode; and
   a contact electrode formed over the semiconductor substrate to contact the sidewalls and an uppermost surface of the gate electrode,
   wherein the gate electrode comprises:
   a high-concentration region into which a conductive impurity is implanted; and
   a low-concentration region into which a conductive impurity having a lower-concentration than the high-concentration region is implanted, and
   wherein the spacers comprise:
   a first spacer formed directly contacting both the high-concentration region and the low-concentration region; and
   a second spacer formed directly contacting both the first spacer and the high-concentration region.

2. The device of claim 1, wherein the gate electrode further comprises a silicide layer formed over and contacting the high-concentration region.

3. The device of claim 1, further comprising lightly doped drain (LDD) regions formed in the semiconductor substrate below and overlapping the spacers and the low-concentration region.

4. The device of claim 1, wherein the high-concentration region is formed over a channel region of the semiconductor substrate and the low-concentration region is formed adjacent to and contacts a respective one of the spacers.

5. The device of claim 1, wherein the spacers have a lower height than the gate electrode.

6. The device of claim 1, wherein the low-concentration region is formed at bottom edge portions of the gate electrode, and the high-concentration region is formed between the low-concentration region and a silicide layer formed over and contacting the high-concentration region, wherein the high-concentration region is provided between the low-concentration region and the silicide layer to prevent the low-concentration region from directly contacting the silicide layer.

7. A device comprising:
   a silicon substrate;
   a gate electrode formed over the silicon substrate, the gate electrode including low-concentration conductive impurity regions formed spaced apart at bottom edge portions of the gate electrode, a high-concentration conductive impurity region formed between the low-concentration conductive impurity regions and a first silicide layer formed over the high-concentration conductive impurity region;
   spacers formed at sidewalls of the gate electrode and exposing a portion of the sidewalls of the gate electrode;
   source/drain regions formed in the silicon substrate adjacent lateral sides of the gate electrode;
   a dielectric film formed over the silicon substrate including the gate electrode and the source/drain regions; and
   contact electrodes formed penetrating through the dielectric film including a first contact electrode connected electrically to the gate electrode and a second contact electrode connected electrically to the source/drain regions, and
   wherein the spacers comprise:
   a first spacer formed directly contacting both the high-concentration conductive impurity region and at least one of the low-concentration conductive impurity regions; and
   a second spacer formed directly contacting both the first spacer and the high-concentration impurity region.

8. The device of claim 7, wherein the source/drain regions comprise:
   a first source/drain region into which high-concentration conductive impurities are implanted and second source/drain region comprising a second silicide layer formed over the first source/drain region.

9. The device of claim 7, wherein the high-concentration conductive impurity region corresponds to a channel region in the silicon substrate.

10. The device of claim 7, further comprising:
    a well formed in the silicon substrate;
    shallow trench isolation films formed in the silicon substrate;
    a gate dielectric film formed between the well and the gate electrode; and
    lightly doped drain (LDD) regions formed in the well overlapping the spacers and the low-concentration conductive impurity regions and contacting the source/drain regions.

11. The device of claim 10, wherein the high-concentration conductive impurity region corresponds to a region between the LDD regions.

12. The device of claim 7, wherein the second spacer contacts:
    an uppermost surface of the first spacer and a sidewall of the first spacer;
    a portion of the sidewall of the first silicide layer and the high-concentration conductive impurity region.

13. The device of claim 7, wherein the low-concentration conductive impurity regions are formed spaced apart at bottom edge portions of the gate electrode, and the high-concentration conductive impurity region is formed between the low-concentration conductive impurity regions and a silicide layer formed over and contacting the high-concentration conductive impurity region, wherein the high-concentration conductive impurity region is provided between the low-concentration conductive impurity regions and the silicide layer to prevent the low-concentration conductive impurity regions from directly contacting the silicide layer.

14. A method comprising:
  forming a gate electrode over a silicon substrate, the gate electrode including first conductive impurity regions formed spaced apart at bottom edge portions of the gate electrode, a second conductive impurity region formed between the first conductive impurity regions and a first silicide layer formed over the second conductive impurity region; and then
  forming spacers exposing a portion of sidewalls of the gate electrode, wherein forming the spacers comprises:
  forming a first spacer directly contacting both the first conductive impurity regions and the second conductive impurity region; and then
  forming a second spacer directly contacting both the first spacer and the second conductive impurity region; and then
  forming source/drain regions in the silicon substrate adjacent lateral sides of the gate electrode; and then
  forming a dielectric film over the silicon substrate including the gate electrode and the source/drain regions; and then
  forming a first contact electrode in the dielectric film connected electrically to the gate electrode and a second contact electrode in the dielectric film connected electrically to the source/drain regions, wherein the first contact electrode contacts the uppermost surface of the gate electrode and a sidewall of the gate electrode.

15. The method of claim 14, wherein the first gate electrode conductive impurity regions comprises low-concentration conductive impurity regions and the second conductive impurity region comprises a high-concentration conductive impurity region.

16. The method of claim 14, further comprising, before forming the gate electrode, forming a well formed in the silicon substrate, wherein the gate electrode is formed over the well and the source/drain regions are formed in the well.

17. The method of claim 16, further comprising, before forming the source/drain regions: forming lightly doped drain (LDD) regions in the well overlapping the spacers and the first conductive impurity regions.

18. The method of claim 14, wherein the second conductive impurity region corresponds to a channel region in the silicon substrate.

* * * * *